United States Patent
Sato

(10) Patent No.: US 9,508,627 B2
(45) Date of Patent: Nov. 29, 2016

(54) ELECTRONIC DEVICE AND METHOD OF MANUFACTURING THE SAME

(71) Applicant: FUJITSU LIMITED, Kawasaki-shi, Kanagawa (JP)

(72) Inventor: Motonobu Sato, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/001,575

(22) Filed: Jan. 20, 2016

(65) Prior Publication Data

US 2016/0141222 A1    May 19, 2016

Related U.S. Application Data

(63) Continuation of application No. PCT/JP2013/083585, filed on Dec. 16, 2013.

(30) Foreign Application Priority Data

Jul. 23, 2013  (JP) .................................. 2013-152986

(51) Int. Cl.
*H01L 23/48* (2006.01)
*H01L 23/367* (2006.01)
(Continued)

(52) U.S. Cl.
CPC ......... *H01L 23/3677* (2013.01); *H01L 23/373* (2013.01); *H01L 23/3736* (2013.01); *H01L 23/3737* (2013.01); *H01L 23/42* (2013.01); (Continued)

(58) Field of Classification Search
CPC ........... H01L 23/3677; H01L 21/4882; H01L 23/3737; H01L 21/4871; H01L 23/367; H01L 23/3736; H01L 23/42
See application file for complete search history.

(56) References Cited

U.S. PATENT DOCUMENTS

| 2008/0131655 A1* | 6/2008 | Wacker ............... F28F 13/185 428/119 |
| 2009/0008779 A1* | 1/2009 | Suhir ..................... B82Y 10/00 257/751 |

(Continued)

FOREIGN PATENT DOCUMENTS

| JP | 2010-118609 A1 | 5/2010 |
| JP | 2010-192656 A1 | 9/2010 |

(Continued)

OTHER PUBLICATIONS

Office Action of Taiwanese Patent Application No. 102147476 dated May 28, 2015 (4 Sheets, 4 Sheets translation, 8 Sheets total).

(Continued)

*Primary Examiner* — Nicholas Tobergte
(74) *Attorney, Agent, or Firm* — Kratz, Quintos & Hanson, LLP

(57) ABSTRACT

In manufacturing an electronic device in which a semiconductor chip including an element layer formed on a front surface of a substrate and a heat sink to perform heat radiation of the semiconductor chip are connected via a heat spreader, a first heat spreader is formed on a rear surface of the semiconductor chip using a first carbon nanotube, a second heat spreader is formed on the heat sink using a second carbon nanotube, and the first heat spreader and the second heat spreader are caused to adhere to each other. With this configuration, a highly reliable electronic device that has very low heat resistance and achieves efficient heat radiation with a relatively simple configuration is fabricated.

6 Claims, 5 Drawing Sheets

(51) Int. Cl.
   *H01L 23/373* (2006.01)
   *H01L 23/42* (2006.01)
   *H01L 21/48* (2006.01)

(52) U.S. Cl.
   CPC ........ *H01L 21/4871* (2013.01); *H01L 21/4882* (2013.01); *H01L 23/367* (2013.01); *H01L 2224/16225* (2013.01); *H01L 2224/73253* (2013.01); *H01L 2924/0002* (2013.01)

(56) References Cited

U.S. PATENT DOCUMENTS

| | | |
|---|---|---|
| 2010/0027221 A1 | 2/2010 | Iwai |
| 2010/0124025 A1 | 5/2010 | Yamaguchi |
| 2012/0218713 A1 | 8/2012 | Yamaguchi |

FOREIGN PATENT DOCUMENTS

| | | |
|---|---|---|
| JP | 2010-192661 A1 | 9/2010 |
| JP | 2010-267706 A1 | 11/2010 |
| JP | 2012-199598 A1 | 10/2012 |

OTHER PUBLICATIONS

Written Opinion of the International Searching Authority for International Application No. PCT/JP2013/083585 dated Mar. 18, 2014 (5 Sheets total).
International Search Report for International Application No. PCT/JP2013/083585 dated Mar. 18, 2014.
Office Action of corresponding Taiwanese Patent Application No. 102147476 dated May 23, 2016, with translation of relevant part.

\* cited by examiner

REAR SURFACE

ELECTRONIC DEVICE AND METHOD OF MANUFACTURING THE SAME

CROSS-REFERENCE TO RELATED APPLICATIONS

This application is a continuation application of International Application PCT/JP2013/083585 filed on Dec. 16, 2013 and designated the U.S., which claims the benefit of priority of the prior Japanese Patent Application No. 2013-152986, filed on Jul. 23, 2013, the entire contents of which are incorporated herein by reference.

FIELD

The embodiment discussed herein is directed to an electronic device and a method of manufacturing the same.

BACKGROUND

In recent years, there are electronic devices, for example, a semiconductor device and the like in which a heat spreader with TIM1 and TIM2 being a highly heat conductive adhesive material added to its upper and lower surfaces is provided between a semiconductor element and a heat sink as a heat radiation technique. Further, there is also devised a heat radiation technique in which a carbon nanotube (CNT) is formed between a semiconductor element and a heat sink (see, for example, Patent Documents 1 to 3).

[Patent Document 1] Japanese Laid-open Patent Publication No. 2010-192656
[Patent Document 2] Japanese Laid-open Patent Publication No. 2010-192661
[Patent Document 3] Japanese Laid-open Patent Publication No. 2010-267706

However, the above-described heat radiation techniques using the CNT each have a problem that heat resistance increases at a joint place between the semiconductor element and the heat sink, to thereby make it impossible to perform sufficient heat radiation.

SUMMARY

An electronic device, comprising:
an electronic part including an element layer formed on a front surface of a substrate;
a heat sink performing heat radiation of the electronic part; and
a heat spreader provided between a rear surface of the electronic part and the heat sink;
wherein the heat spreader comprises a first heat spreader formed on the rear surface of the electronic part and the first heat spreader comprising a first carbon nanotube; and
a second heat spreader formed on the heat sink and the second heat spreader comprising a second carbon nanotube.

A method of manufacturing an electronic device of the embodiment is a method of manufacturing an electronic device in which an electronic part including an element layer formed on a front surface of a substrate and a heat sink to perform heat radiation of the electronic part are connected via a heat spreader, the method including:
forming a first heat spreader on a rear surface of the electronic part using a first carbon nanotube;
forming a second heat spreader on the heat sink using a second carbon nanotube; and
causing the first heat spreader and the second heat spreader to adhere to each other.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENT

Hereinafter, a concrete embodiment to which the embodiment is applied will be explained in detail with reference to the drawings.

In this embodiment, as an electronic device, a semiconductor device provided with a transistor element having a MOS structure as a functional element will be disclosed together with its manufacturing method. Incidentally, as the semiconductor device, ones having various memory elements, capacitor elements, and the like as a functional element can be applied other than the MOS transistor in this embodiment.

FIG. 1A to FIG. 5B are schematic cross-sectional views illustrating the method of manufacturing the semiconductor device according to this embodiment in order of processes.

First, each semiconductor chip is formed.

Figure 1A:
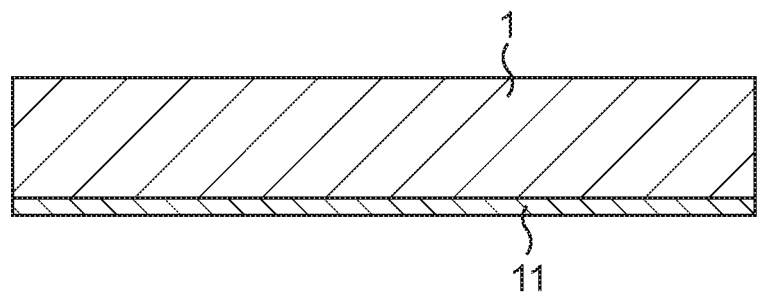
FIG. 1A is a schematic cross-sectional view illustrating a method of manufacturing an electronic device according to an embodiment in order of processes.

As illustrated in FIG. 1A, a semiconductor substrate including an element layer 11 formed on a front surface thereof, which is, for example, a silicon substrate 1, is prepared.

The element layer 11 is one made in a manner that the transistor element having a MOS structure as a functional element, its wiring structure, and the like are formed in an insulating film, for example.

Figure 1B:
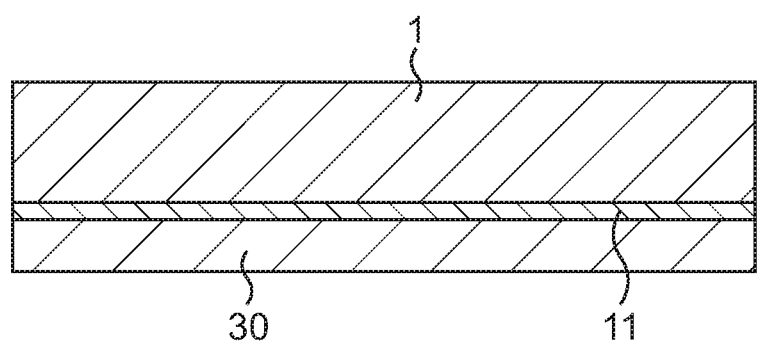
FIG. 1B is a schematic cross-sectional view illustrating, subsequent to FIG. 1A, the method of manufacturing the electronic device according to the embodiment in order of processes.

Subsequently, as illustrated in FIG. 1B, the front surface side of the silicon substrate 1 (the element layer 11 side) is mounted and fixed to a supporting substrate 30.

Figure 1C:
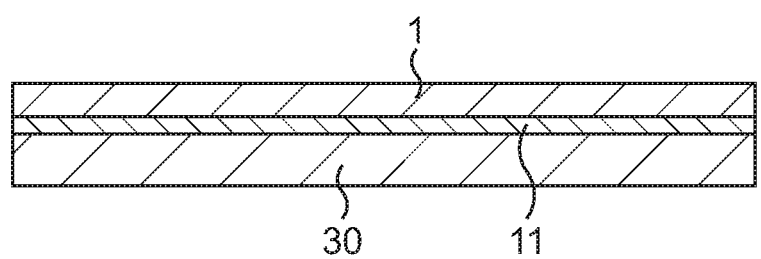
FIG. 1C is a schematic cross-sectional view illustrating, subsequent to FIG. 1B, the method of manufacturing the electronic device according to the embodiment in order of processes.

Subsequently, as illustrated in FIG. 1C, a rear surface of the silicon substrate 1 is ground by back-grinding, and thereby the silicon substrate 1 is thinned to a predetermined thickness.

Figure 2A:
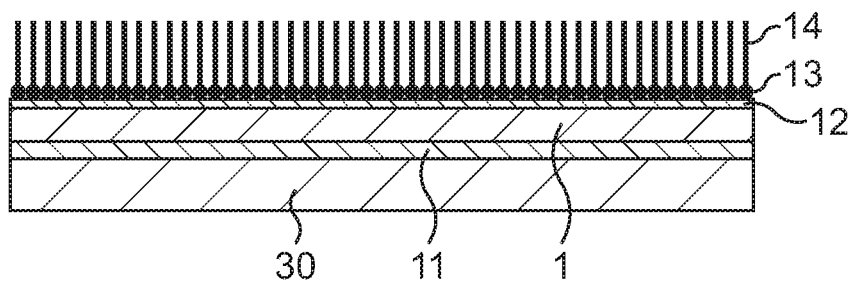
FIG. 2A is a schematic cross-sectional view illustrating, subsequent to FIG. 1C, the method of manufacturing the electronic device according to the embodiment in order of processes.

Subsequently, as illustrated in FIG. 2A, a CNT 14 is made to grow at the rear surface of the silicon substrate 1.

In more detail, first, for example, Ti, TiN, Ta, TaN, or the like is deposited into a thickness of several nanometers or so to 20 nm or so by a sputtering method or the like. Thereby, a base material 12 being a barrier metal is formed on the rear surface of the silicon substrate 1.

Next, a catalyst material is deposited into a thickness of several nanometers or so, for example, by a vacuum deposition method or the like. As the catalyst material, a mixed material of one kind or two or more kinds selected from among Co, Ni, Fe, Ti, V, and so on is used. For example, Co/Ti or Co/V is selected. Thereby, a catalyst material 13 is formed on the base material 12 at the rear surface of the silicon substrate 1.

Next, for example, by a thermal CVD method, growth processing of the carbon nanotube (CNT) is performed with a growth temperature set to a value in a low-temperature range of 400° C. to 450° C., which is 450° C. or so here. Thereby, the CNT 14 is formed so as to stand up from the catalyst material 13 existing at the rear surface of the silicon substrate 1. The CNT 14 is formed to a length of several micrometers or so to several hundred micrometers or so, for example. The CNT is a material higher in heat conductivity and better in heat radiation performance than silicon that is the substrate material.

Figure 2B:
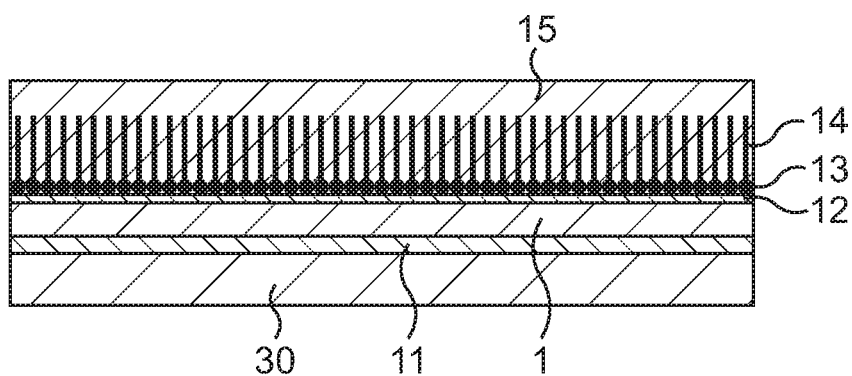
FIG. 2B is a schematic cross-sectional view illustrating, subsequent to FIG. 2A, the method of manufacturing the electronic device according to the embodiment in order of processes.

Subsequently, as illustrated in FIG. 2B, a metal material 15 used for the CNT 14 to be embedded therein is formed.

In more detail, as the metal material 15 high in heat conductivity, for example, Cu is formed at the rear surface of the silicon substrate 1 so that the CNT 14 is embedded therein by an electrolytic plating method or the like. Thereby, a composite material of the CNT 14 and the metal material 15 with the CNT 14 embedded therein is formed at the rear surface of the silicon substrate 1. As the metal material 15, for example, Ag, Au, or the like can be used in place of Cu. Further, in place of plating, a metal nanoparticle dispersion liquid or the like can also be used.

Figure 2C:
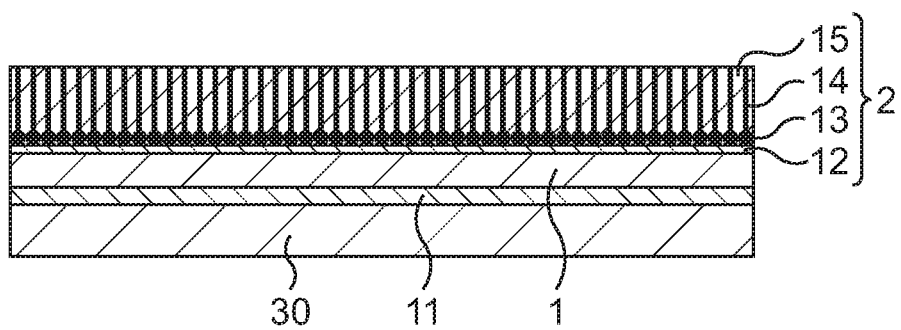
FIG. 2C is a schematic cross-sectional view illustrating, subsequent to FIG. 2B, the method of manufacturing the electronic device according to the embodiment in order of processes.

Subsequently, as illustrated in FIG. 2C, the extra metal material 15 of the composite material is removed.

In more detail, by a chemical mechanical polishing (CMP) method, for example, the metal material 15 of the composite material is polished and removed until a tip of the CNT 14 in the composite material is exposed. Thereby, a first heat spreader 2 that is made of the composite material and has a flat front surface from which the tip of the CNT 14 is exposed is formed.

Figure 3A:
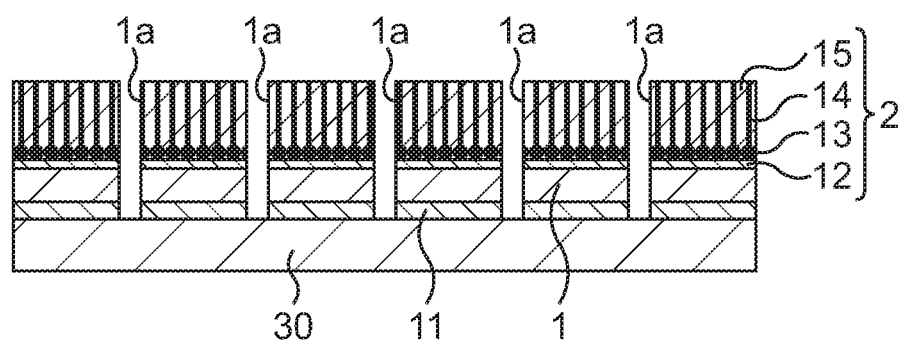
FIG. 3A is a schematic cross-sectional view illustrating, subsequent to FIG. 2C, the method of manufacturing the electronic device according to the embodiment in order of processes.

Subsequently, as illustrated in FIG. 3A, the silicon substrate 1 is subjected to a dicing process to be diced into individual semiconductor chips along each dicing line 1a.

Figure 3B:
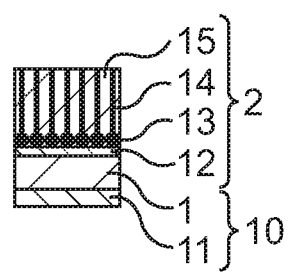
FIG. 3B is a schematic cross-sectional view illustrating, subsequent to FIG. 3A, the method of manufacturing the electronic device according to the embodiment in order of processes.

Subsequently, as illustrated in FIG. 3B, each semiconductor chip 10 is separated from the supporting substrate 30.

The semiconductor chip 10 is made by the element layer 11 being formed on the front surface of the silicon substrate 1. The first heat spreader 2 is formed on a rear surface of the semiconductor chip 10.

Next, a heat sink is formed.

Figure 4A:
FIG. 4A is a schematic cross-sectional view illustrating, subsequent to FIG. 3B, the method of manufacturing the electronic device according to the embodiment in order of processes.

As illustrated in FIG. 4A, a base 3 for the heat sink is prepared. The base 3 is made of a metal material high in heat conductivity such as Cu or Al, for example.

Figure 4B:
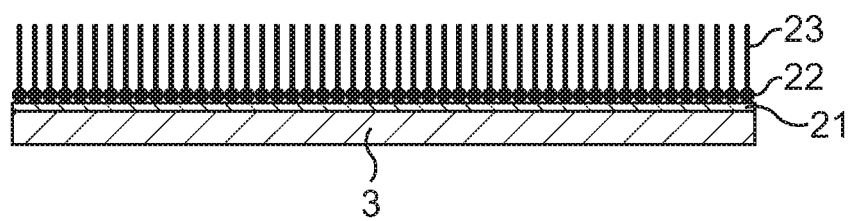
FIG. 4B is a schematic cross-sectional view illustrating, subsequent to FIG. 4A, the method of manufacturing the electronic device according to the embodiment in order of processes.

Subsequently, as illustrated in FIG. 4B, a CNT 23 is made to grow at a rear surface of the base 3.

In more detail, first, for example, Ti, TiN, Ta, TaN, or the like is deposited into a thickness of several nanometers or so to 20 nm or so by a sputtering method or the like. Thereby, a base material 21 being a barrier metal is formed on the rear surface of the base 3.

Next, a catalyst material is deposited into a thickness of several nanometers or so, for example, by a vacuum deposition method or the like. As the catalyst material, a mixed material of one kind or two or more kinds selected from among Co, Ni, Fe, Ti, V, and so on is used. For example, Co/Ti or Co/V is selected. Thereby, a catalyst material 22 is formed on the base material 21 at the rear surface of the base 3.

Next, for example, by a thermal CVD method, growth processing of the carbon nanotube (CNT) is performed with a growth temperature set to a value in a low-temperature range of 400° C. to 450° C., which is 450° C. or so here. Thereby, the CNT 23 is formed so as to stand up from the catalyst material 22 existing at the rear surface of the base 3. The CNT 23 is formed to a length of several micrometers or so to several hundred micrometers or so, for example. The CNT is a material higher in heat conductivity and better in heat radiation performance than Cu or the like that is the base material.

Figure 4C:
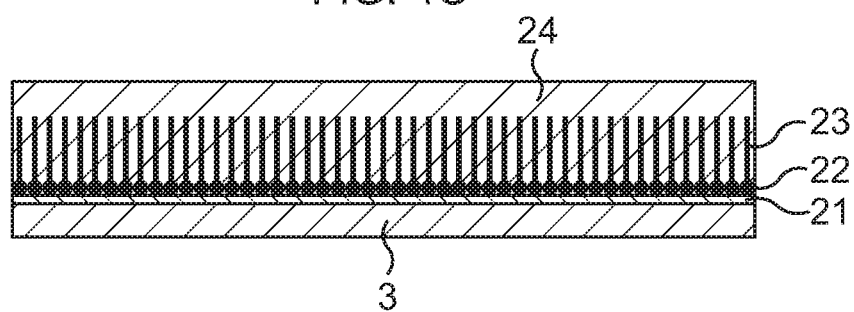
FIG. 4C is a schematic cross-sectional view illustrating, subsequent to FIG. 4B, the method of manufacturing the electronic device according to the embodiment in order of processes.

Subsequently, as illustrated in FIG. 4C, a metal material 24 used for the CNT 23 to be embedded therein is formed.

In more detail, as the metal material 24 high in heat conductivity, for example, Cu is formed at the rear surface of the base 3 so that the CNT 23 is embedded therein by an electrolytic plating method or the like. Thereby, a composite material of the CNT 23 and the metal material 24 with the CNT 23 embedded therein is formed at the rear surface of the base 3. As the metal material 24, for example, Ag, Au, or the like can be used in place of Cu. Further, in place of plating, a metal nanoparticle dispersion liquid or the like can also be used.

Figure 4D:
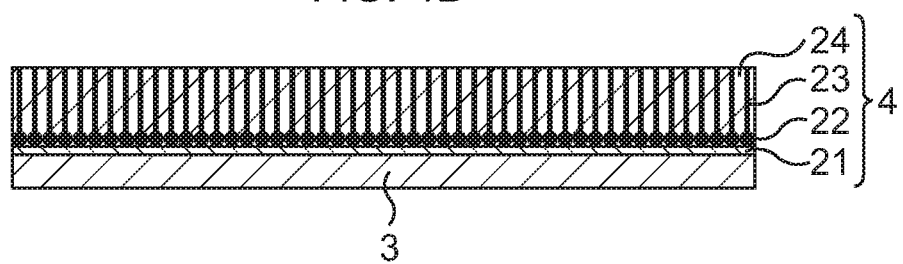
FIG. 4D is a schematic cross-sectional view illustrating, subsequent to FIG. 4C, the method of manufacturing the electronic device according to the embodiment in order of processes.

Subsequently, as illustrated in FIG. 4D, the extra metal material 24 of the composite material is removed.

In more detail, by a CMP method, for example, the metal material 24 of the composite material is polished and removed until a tip of the CNT 23 in the composite material is exposed. Thereby, a second heat spreader 4 that is made of the composite material and has a flat front surface from which the tip of the CNT 23 is exposed is formed.

Figure 5A:
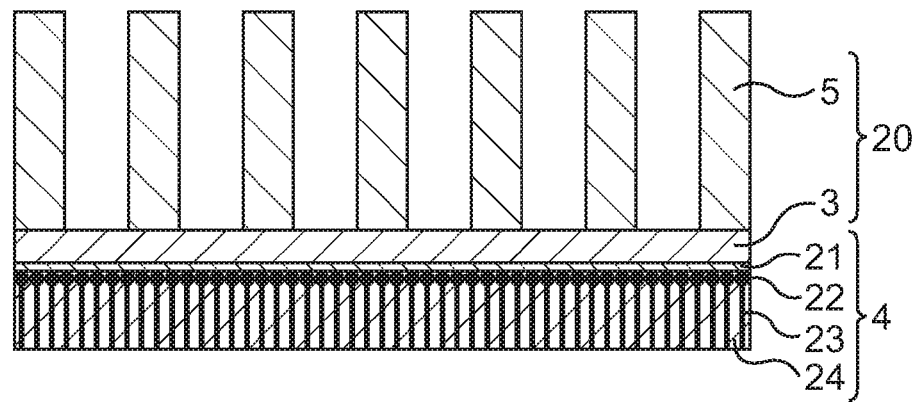
FIG. 5A is a schematic cross-sectional view illustrating, subsequent to FIG. 4D, the method of manufacturing the electronic device according to the embodiment in order of processes.

Subsequently, as illustrated in FIG. 5A, a heat radiation fin 5 is formed on a front surface of the base 3. The heat radiation fin 5 is desirably formed of the same metal high in heat conductivity as that of the base 3. In this manner, a heat sink 20 made by the heat radiation fin 5 being provided on the front surface of the base 3 is formed. On a rear surface of the heat sink 20, the second heat spreader 4 is formed.

Figure 5B:
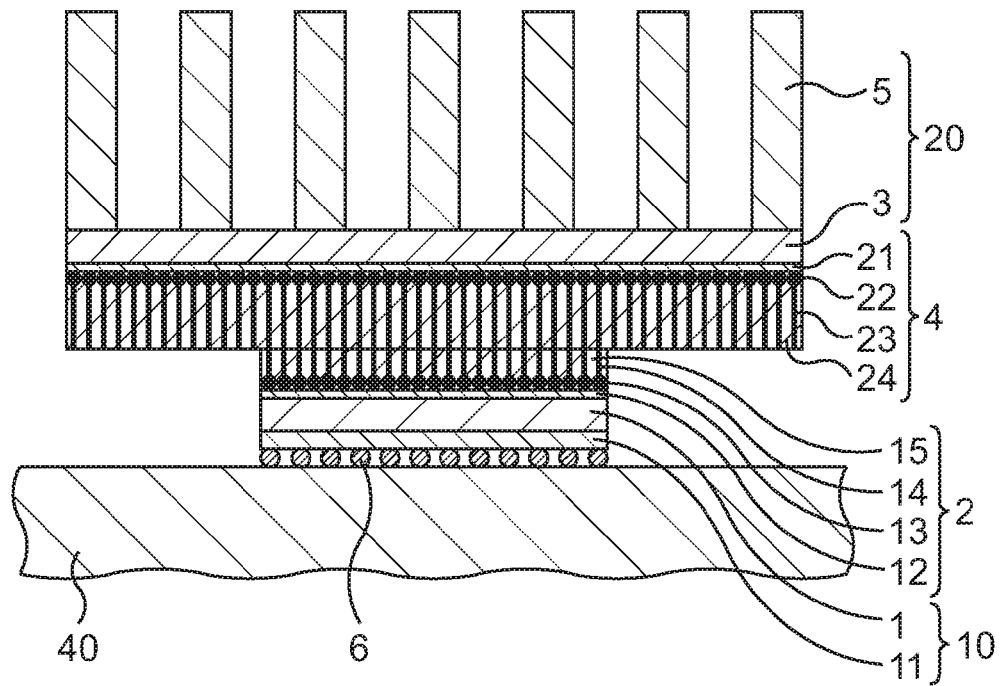
FIG. 5B is a schematic cross-sectional view illustrating, subsequent to FIG. 5A, the method of manufacturing the electronic device according to the embodiment in order of processes.

Subsequently, as illustrated in FIG. 5B, the front surface of the first heat spreader 2 on the semiconductor chip 10 and the front surface of the second heat spreader 4 on the heat sink 20 are faced each other and the both are brought into contact with each other directly. The front surfaces of the first and second heat spreaders 2, 4 are each made flat by the CMP method to be brought into a state excellent in flatness, and the both are brought into contact with each other at a predetermined pressure in a vacuum atmosphere, to thereby adhere and be fixed. At this time, it is also possible that an indium layer is formed at a joint surface and thermal joining is performed simultaneously with pressurization.

On terminals on the front surface of the element layer 11 of the semiconductor chip 10, for example, solder balls 6 are provided to be electrically connected to a predetermined mounting substrate 40. In this manner, the semiconductor device in this embodiment is formed.

In the semiconductor device in this embodiment, the front surfaces of the first and second heat spreaders 2, 4 are faced each other to adhere and be fixed, and thereby a heat spreader is constituted. In this case, there is no inclusion with high heat resistance in the heat spreader itself constituted by the first and second heat spreaders 2, 4, between the heat spreader and the semiconductor chip 10, and between the heat spreader and the heat sink 20. According to this embodiment as above, it is possible to obtain a highly reliable semiconductor device that has very low heat resistance and achieves efficient heat radiation with a relatively simple configuration.

According to the embodiment, there is fabricated a highly reliable electronic device that has very low heat resistance and enables efficient heat radiation with a relatively simple configuration.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An electronic device, comprising:
    an electronic part including an element layer formed on a front surface of a substrate;
    a heat sink performing heat radiation of the electronic part; and
    a heat spreader provided between a rear surface of the electronic part and the heat sink,
    wherein the heat spreader comprises
        a first heat spreader formed on the rear surface of the electronic part and comprising a first composite material of a first carbon nanotube and a first metal, and
        a second heat spreader formed on the heat sink and comprising a second composite material of a second carbon nanotube and a second metal,
    wherein the first composite material has a first flat surface and the second composite material has a second flat surface, and
    the first flat surface where a tip of the first carbon nanotube is located and the second flat surface where a tip of the second carbon nanotube is located are caused to adhere to each other with facing and being brought into contact with each other.

2. The electronic device according to claim 1, wherein
    the flat surface of the first composite material and the flat surface of the second composite material are caused to directly adhere to each other.

3. A method of manufacturing an electronic device being a method of manufacturing an electronic device in which an electronic part including an element layer formed on a front surface of a substrate and a heat sink to perform heat radiation of the electronic part are connected via a heat spreader, the method comprising:
    forming a first heat spreader on a rear surface of the electronic part using a first composite material of a first carbon nanotube and a first metal;
    forming a second heat spreader on the heat sink using a second composite material of a second carbon nanotube and a second metal; and
    wherein the first composite material has a first flat surface and the second composite material has a second flat surface, further comprising
    causing the first flat surface where a tip of the first carbon nanotube is located and the second flat surface where a tip of the second carbon nanotube is located to adhere to each other with facing and being brought into contact with each other.

4. The method of manufacturing the electronic device according to claim 3, wherein
    the flat surface of the first composite material and the flat surface of the second composite material are caused to directly adhere to each other.

5. The semiconductor device according to claim 1, wherein
    the first flat surface where a tip of the first carbon nanotube is located and the second flat surface where a tip of the second carbon nanotube is located are caused to adhere to each other with facing and being brought into contact with each other while placing a third metal therebetween.

6. The method of manufacturing the electronic device according to claim 3, wherein
    the first flat surface where a tip of the first carbon nanotube is located and the second flat surface where a tip of the second carbon nanotube is located are caused to adhere to each other with facing and being brought into contact with each other while placing a third metal therebetween.

* * * * *